United States Patent [19]

Isohata et al.

[11] Patent Number: 4,768,064
[45] Date of Patent: Aug. 30, 1988

[54] CONVEYOR DEVICE FOR ALIGNMENT

[75] Inventors: Junji Isohata; Mikio Nakasugi, both of Tokyo; Takao Yokomatsu, Yokohama, all of Japan

[73] Assignee: Canon Kabushiki Kaisha, Tokyo, Japan

[21] Appl. No.: 139,114

[22] Filed: Dec. 28, 1987

Related U.S. Application Data

[63] Continuation of Ser. No. 80,194, Jul. 31, 1987, abandoned, which is a continuation of Ser. No. 898,803, Aug. 21, 1986, abandoned, which is a continuation of Ser. No. 627,522, Jul. 3, 1984, abandoned.

[30] Foreign Application Priority Data

Jul. 13, 1983 [JP] Japan .............................. 58-126085

[51] Int. Cl.$^4$ ............................................. G03B 27/42
[52] U.S. Cl. ...................................... 355/53; 104/284; 104/293
[58] Field of Search ................... 355/53; 104/284, 293

[56] References Cited

U.S. PATENT DOCUMENTS

| | | | |
|---|---|---|---|
| 3,516,361 | 6/1970 | Hart | 104/293 |
| 3,569,718 | 3/1971 | Borner | 355/53 |
| 3,899,979 | 8/1975 | Godsey | 104/284 |
| 4,055,123 | 10/1977 | Heidelberg | 104/284 |
| 4,084,903 | 4/1978 | Pircher | 355/53 |
| 4,140,392 | 2/1979 | Lacombat et al. | 355/53 |
| 4,172,656 | 10/1979 | Lacombat et al. | 355/53 |
| 4,370,054 | 1/1983 | Isohata et al. | 355/53 |

Primary Examiner—Monroe H. Hayes
Attorney, Agent, or Firm—Fitzpatrick, Cella, Harper & Scinto

[57] ABSTRACT

A conveyor device for alignment in which minutely displaceable members and hydraulic fluid supply pads are disposed between a slide and a guide. The relative position of the slide and the guide is adjusted by controlling the dimension of the minutely displaceable members.

3 Claims, 1 Drawing Sheet

CONVEYOR DEVICE FOR ALIGNMENT

This application is a continuation of application Ser. No. 080,194 filed July 31, 1987, now abandoned; which was a continuation of application Ser. No. 898,803 filed Aug. 21, 1986, now abandoned; which was a continuation of application Ser. No. 627,522 filed July 3, 1984, now abandoned.

BACKGROUND OF THE INVENTION

1. Field of the Invention

This invention relates to a conveyor device for effecting alignment, and more particularly to a conveyor device for effecting alignment conveniently and which may be used for the alignment of the stage of a semiconductor manufacturing apparatus to achieve highly accurate alignment of a mask and a wafer.

2. Description of the Prior Art

The restraining type gas bearing conveyor device heretofore used as a positioning mechanism for a stage effects the positioning of the stage by controlling the gas pressure supplied to a gas supply pad forming a part of the conveyor device to a high or a low level. This method, however, suffers from a problem that the supplied gas pressure need be varied and therefore, when the supplied gas pressure is controlled to a low level, the rigidity of the guide deteriorates and the gas bearing conveyor device becomes weaker in its resistance to disturbance. There is also a problem that the gap between the guide forming a part of the gas bearing conveyor device and the pad is usually as small as about 10 $\mu$m and when the degree of tolerance in the operation as a gas bearing conveyor device is taken into consideration, only several $\mu$m can be used as the amount of control.

SUMMARY OF THE INVENTION

The present invention has been made in view of the above-noted problems and an object thereof is to provide a gas bearing conveyor device in which minutely displaceable members are provided. Such members are controlled to thereby impart no variation to the performance as a gas bearing conveyor device and to enable a greater amount of control to be secured.

DESCRIPTION OF THE PREFERRED EMBODIMENT

Figure 1:
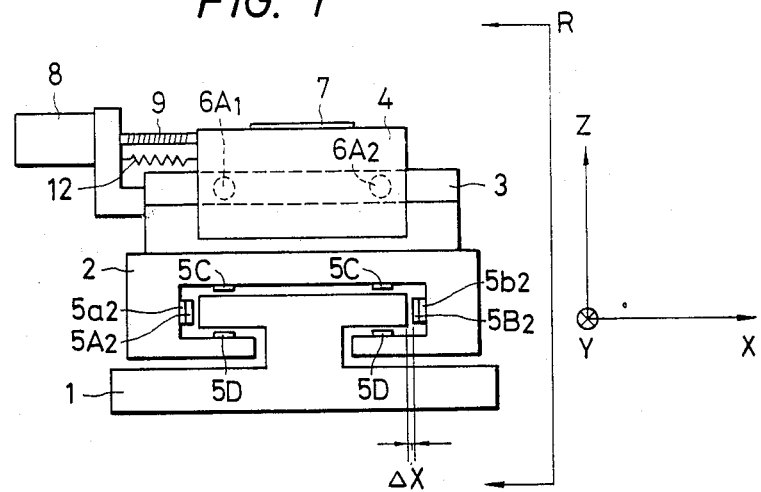
FIG. 1 is a front view of the conveyor device of the present invention.
Figure 2:
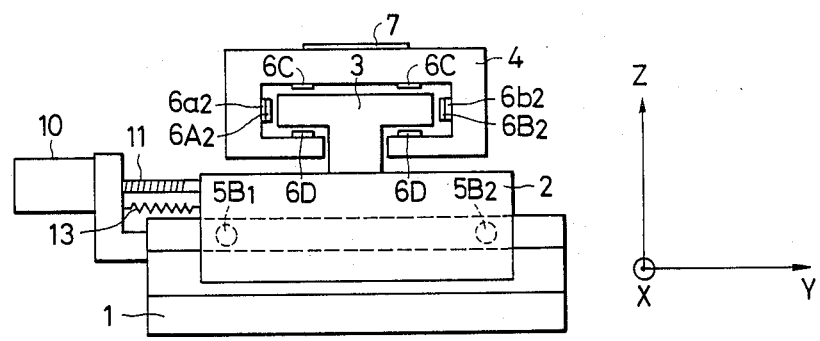
FIG. 2 is a side view of the conveyor device as seen from the direction of arrow R in FIG. 1.
Figure 3:
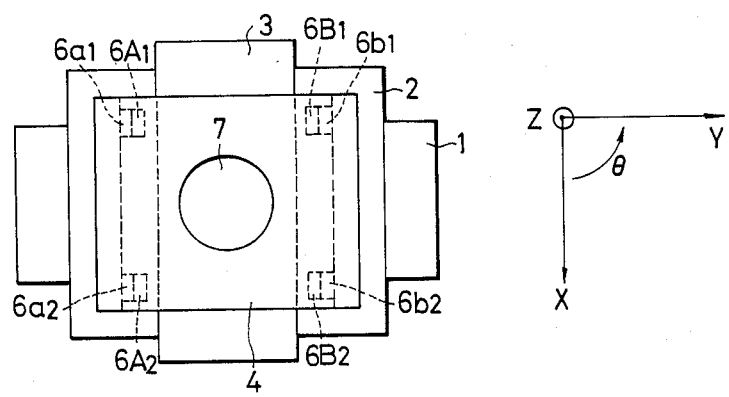
FIG. 3 is a plan view of the conveyor device.

The details of the present invention will hereinafter be described with reference to the drawings. FIGS. 1, 2 and 3 show an embodiment of an X-Y-$\theta$ stage utilizing and a restraining type gas bearing conveyor device according to the present invention. In FIG. 1, reference numeral 1 designates a fixed Y-direction guide, and reference numeral 2 denotes a Y-direction slide which is restrained in X-direction by gas supply pads $5A_1$ (not shown), $5A_2$, $5B_1$, and $5B_2$, is restrained in the Z-direction by gas supply pads 5C and 5D, and floats up relative to the Y-direction guide 1. Reference characters $5a_2$ and $5b_2$ ($5a_1$ and $5b_1$ not being shown), designate minutely displaceable members, two of each of which are provided and interposed between the Y-direction slide 2 and the gas supply pad 5A and between the Y-direction slide 2 and the gas supply pad 5B, respectively. As the members $5a$ and $5b$, use may be made of members having a piezo-electric effect and having the voltage thereof controlled by a power source device, not shown, or diaphragm or bellows members expanded and contracted by a hydraulic pressure. In FIGS. 2 and 3, reference numeral 3 designates an X-direction guide which is fixed onto the Y-direction slide 2 and extends perpendicularly to Y-direction. Reference numeral 4 denotes an X-direction slide which is restrained in the Y-direction by gas supply pads $6A_1$, $6A_2$, $6B_1$ and $6B_2$, is restrained in the Z-direction by gas supply pads 6C and 6D, and floats up relative to the X-direction guide 3. Reference characters $6a_1$, $6a_2$, $6b_1$ and $6b_2$ designate minutely displaceable members interposed between the X-direction slide 4 and the gas supply pads $6A_1$, $6A_2$, $6B_1$, $6B_2$, respectively. Reference numerals 8 and 10 denote drive motors fixed to the X-direction guide 3 and Y-direction guide 1, respectively. Reference numerals 9 and 11 designate feed screws which serve to move the X-direction slide 4 and the Y-direction slide 2 in the positive direction of X and the positive direction of Y, respectively, when driven by the motors 8 and 10, respectively. Reference numerals 12 and 13 denote tension springs which serve to move the slides 4 and 2 in the directions opposite to said directions of motor-driven movement. Positioning of a wafer 7 for manufacturing a semiconductor placed on the X-direction slide 4 is accomplished by the following method.

As regards the positioning in the X-direction (see FIG. 1), the X-direction slide 4 is first moved by the drive motor 8 through the feed screw 9. The drive motor 8 is stopped when positioning accuracy on the order of 10 $\mu$m, i.e., within rough adjustment, has been indicated by the output signal (a desired amount of control) of a laser interferometer or the like, not shown. Next, the minutely displaceable members $5a$ and $5b$ fixed to the Y-direction slide 2 are varied by the same amount in the same direction (fine adjustment). For example, where there is an error of 1 $\mu$m between the output signal of the laser interferometer or the like and the rough adjustment and it is desired to move the X-diretion slide in the positive direction of X, the minutely displaceable member $5a$ is contracted by 1 $\mu$m and the minutely displaceable member $5b$ is expanded by 1 $\mu$m. As a result, the Y-direction slide 2 is moved by 1 $\mu$m in the positive direction of X so as to maintain the gap $\Delta x$ between the pads 5A, 5B and the Y-direction guide 1 constant because the gas pressure supplied to the pads 5A and 5B is controlled to a constant value. Thus, the wafer 7 is positioned highly accurately (0.1 $\mu$m or less) in X-direction.

The positioning in the Y-direction (see FIG. 2) need not be described because it can be explained in the same way as the above-described positioning in the X-direction.

The positioning in the $\theta$-direction (the direction in which rotation is effected about the Z-axis) (see FIG. 3) is effected by the use of the X-direction slide 4. For example, where it is desired to effect rotation in clockwise direction (the negative direction of $\theta$) in accordance with the output signal of the afore-mentioned laser interferometer or the like, the minutely displaceable members $6a_1$ and $6b_2$ are contracted by the same amount and the minutely displaceable members $6a_2$ and $6b_1$ are expanded by the same amount as the amount of contraction, whereby the X-direction slide 4 is rotated in clockwise direction and the wafer 7 is positioned highly accurately (0.1 μm or less) in θ-direction. Also, where it is desired to effect rotation in counter-clockwise direction (the positive direction of θ), control (contraction and expansion) of the minutely displaceable members may be effected in a converse way to what has been described above.

According to the present invention, as described above, the gas pressure supplied to the pads is kept constant and the control is such that only the minutely displaceable members are varied. Therefore the rigidity of the guides does not deteriorate, that is, no variation is imparted to the performance as the gas bearing guide and yet the precise amount of control can be obtained.

What we claim is:

1. A positioning apparatus for positioning a stage, used in a semiconductor manufacturing process, relative to a reference portion, comprising:
   a guide surface provided on said reference portion for guiding said stage in a predetermined direction;
   a fluid ejecting member provided on said stage for ejecting fluid toward said guide surface so as to support said stage relative to said reference portion; and
   displacement means for changing the distance between said fluid ejecting member and said stage so as to displace said stage in a direction perpendicular thereto with respect to said reference portion.

2. A positioning apparatus for positioning a stage, used in a semiconductor manufacturing process, relative to a reference portion, comprising:
   a guide surface provided on said reference portion for guiding said stage in a predetermined direction;
   a fluid ejecting member provided on said stage for ejecting fluid toward said guide surface so as to support said stage relative to said reference portion; and
   displacement means for changing the distance between said fluid ejecting member and said stage so as to displace said stage in said predetermined direction and in a direction perpendicular thereto with respect to said reference portion wherein said displacement means has piezoelectric effect and said displacement means moves said stage to a desired position by voltage control.

3. A positioning apparatus for positioning a stage, used in a semiconductor manufacturing process, relative to a reference portion, comprising:
   a guide surface provided on said reference portion for guiding said stage in a predetermined direction;
   a fluid ejecting member provided on said stage for ejecting fluid toward said guide surface so as to support said stage relative to said reference portion; and
   displacement means for changing the distance between said fluid ejecting member and said stage so as to displace said stage in said predetermined direction and in a direction perpendicular thereto with respect to said reference portion wherein said displacement means is a diaphragm and moves said stage to a desired position by fluid pressure control.

* * * * *